(12) United States Patent
Saita et al.

(10) Patent No.: US 9,111,681 B2
(45) Date of Patent: Aug. 18, 2015

(54) THIN FILM CAPACITOR

(71) Applicant: TDK Corporation, Tokyo (JP)

(72) Inventors: Hitoshi Saita, Tokyo (JP); Yoshihiko Yano, Tokyo (JP); Yasunobu Oikawa, Tokyo (JP)

(73) Assignee: TDK Corporation, Tokyo (JP)

( * ) Notice: Subject to any disclaimer, the term of this patent is extended or adjusted under 35 U.S.C. 154(b) by 119 days.

(21) Appl. No.: 13/923,585

(22) Filed: Jun. 21, 2013

(65) Prior Publication Data

US 2013/0342960 A1 Dec. 26, 2013

(30) Foreign Application Priority Data

Jun. 22, 2012 (JP) ................. 2012-141019

(51) Int. Cl.
| | |
|---|---|
| *H01G 4/008* | (2006.01) |
| *H01G 4/01* | (2006.01) |
| *H01G 4/33* | (2006.01) |
| *H01L 49/02* | (2006.01) |

(52) U.S. Cl.
CPC ............. *H01G 4/008* (2013.01); *H01G 4/01* (2013.01); *H01G 4/33* (2013.01); *H01L 28/60* (2013.01)

(58) Field of Classification Search
CPC .................................................... H01G 4/008
USPC ........... 361/311–313, 301.2–301.4, 303–305, 361/309, 306.1, 306.3
See application file for complete search history.

(56) References Cited

U.S. PATENT DOCUMENTS

| | | |
|---|---|---|
| 6,284,654 B1 | 9/2001 | Roeder et al. |
| 2006/0180842 A1* | 8/2006 | Shibata et al. ................. 257/300 |
| 2009/0176345 A1* | 7/2009 | Saita et al. .................... 438/381 |

FOREIGN PATENT DOCUMENTS

| | | |
|---|---|---|
| JP | 2003-092391 A | 3/2003 |
| JP | 2004-281446 A | 10/2004 |
| JP | 2006-135036 A | 5/2006 |

* cited by examiner

*Primary Examiner* — Nguyen T Ha

(74) *Attorney, Agent, or Firm* — Posz Law Group, PLC

(57) ABSTRACT

A thin film capacitor includes a lower electrode layer, a dielectric layer that is provided on said lower electrode layer, and an upper electrode layer that is formed on the dielectric layer. Wherein, the lower electrode layer contains at least a Ni electrode layer, the upper electrode layer configured with at least two layers of a Ni electrode layer and a Cu electrode layer, and the dielectric layer is in contact with both the Ni electrode layer of the lower electrode layer and the Ni electrode layer of the upper electrode layer.

11 Claims, 2 Drawing Sheets

Upper Electrode Layer (Cu)

Dielectric Layer

Lower Electrode Layer
(Ni Metal Foil)

Upper Electrode Layer (Cu)

Upper Electrode Layer (Ni)

Dielectric Layer

Lower Electrode Layer
(Ni Metal Foil)

THIN FILM CAPACITOR

TECHNICAL FIELD

This invention relates to a thin film capacitor.

BACKGROUND

In recent years, the mounting space for electronic parts built in electronic equipment is becoming smaller. For example, there have been many situations where capacitors built in many of electronic equipment must be mounted in a low-profile, small space. Thin film capacitors can be made into lower profiler elements than conventional multi layer ceramic capacitors fabricated by the thick-film processing and facilitate such mounting as described above. Especially, mounting in a place limited in the thickness direction is made possible.

As an example of such thin film capacitors, disclosed in JP Laid-Open Patent Application No. 2004-281446 for example is a thin film capacitor which constructs a dielectric layer containing a dielectric material having a high dielectric constant with Y added as a dopant to $(Ba(1-x)Srx)Ti1+zO3+\delta$, sandwiched by a lower electrode layer and an upper electrode layer. It is preferred that this thin film capacitor contains at least one kind of material selected from a group including transition metals such as Pt, Pd, Au, Ag, Cu, and PtOx, precious metals, conductive oxides, and their combinations or mixtures as the upper electrode layer or the lower electrode layer.

In addition, disclosed in JP Laid-Open Patent Application No. 2006-135036 is a thin film capacitor to be embedded in a printed circuit board. To be specific, provided is a dielectric layer between a first conductive layer used for forming the upper electrode layer and a second conductive layer for forming the lower electrode layer, and the second conductive layer is made a nickel layer or nickel alloy layer. Used as the first conductive layer is copper.

However, these thin film capacitors have a thinner dielectric layer than conventional multi layer ceramic capacitors fabricated by the thick-film method, and were inferior in temperature load test and humidity load test in some cases. In addition, if Cu which is a non-magnetic substance with low resistivity is used as electrode layers of such a thin film capacitor, the equivalent series resistance (ESR) of the capacitor can be decreased, therefore noise can be reduced when used with high frequencies, and preferable characteristics as a capacitor can be obtained. However, according to the investigations by the present inventors, it has become evident that the above-mentioned ill influence on reliability is significant if a metallic material such as Cu is used as the electrode layers.

This invention has been made considering the above-mentioned situation, and its objective is to obtain a thin film capacitor which has sufficient reliability in terms of temperature load test and humidity load test even when Cu is used as the electrode layers of the thin film capacitor and at the same time has a low equivalent series resistance (ESR).

SUMMARY

A thin film capacitor of the present invention includes a lower electrode layer, a dielectric layer that is provided on said lower electrode layer, and an upper electrode layer that is formed on the dielectric layer. Wherein, the lower electrode layer contains at least a Ni electrode layer, the upper electrode layer configured with at least two layers of a Ni electrode layer and a Cu electrode layer, and the dielectric layer is in contact with both the Ni electrode layer of the lower electrode layer and the Ni electrode layer of the upper electrode layer. By adopting such a structure, a thin film capacitor which is superior in temperature load test and humidity load test and has a small equivalent series resistance (ESR) can be obtained.

The Ni electrode layer that is one element configuring the upper electrode layer is preferably has a granular structure. The Cu electrode layer that is another element configuring the upper electrode layer preferably has a columnar structure. Adopting such a structure has efficacies that the humidity load test is further improved and that the equivalent series resistance (ESR) becomes even smaller.

It is preferred that the Ni electrode layer of the upper electrode layer has a thickness of 0.1 μm or more and 2.0 μm or less. By adopting such a structure, it becomes possible to suppress the increase in the equivalent series resistance.

It is preferred that the dielectric layer is a barium titanate system dielectric material. This dielectric material has a perovskite structure as its crystal structure, which allows making its dielectric constant larger than those of other dielectric materials. Further, because no Pb is contained, there is little ill influence on the environment.

It is preferred that the lower electrode layer is a Ni metal foil. Adopting a Ni metal foil allows reducing its difference in thermal expansion coefficient between the dielectric layer and the lower electrode. Therefore, a stress to be applied to the dielectric layer can be decreased and it is possible to prevent decrease capacity of dielectric layer.

The thin film capacitor of this invention is superior in temperature load test and humidity load test and allows providing a thin film capacitor having a small equivalent series resistance (ESR).

DETAILED DESCRIPTION OF THE EMBODIMENT(S)

Below, preferred embodiments of this invention will be explained by referring to drawings. In each of the drawings, identical or equivalent elements will be given the same code, and duplicate explanations will be omitted.

Embodiment 1

Figure 1:
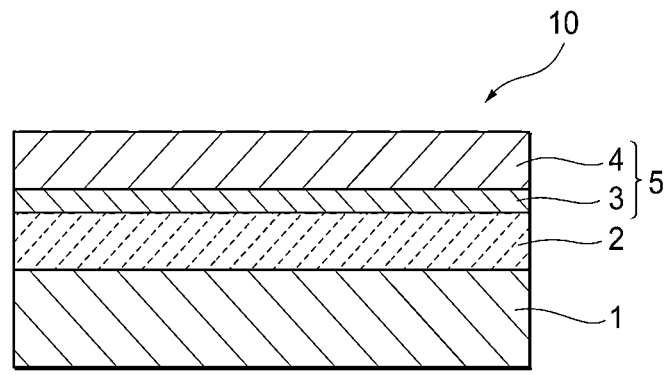
FIG. 1 is a schematic cross-sectional view showing a thin film capacitor of the first embodiment.

FIG. 1 is a cross-sectional view of a thin film capacitor which is the first embodiment of this invention. The thin film capacitor 10 comprises a lower electrode layer 1, a dielectric layer 2 formed on the lower electrode layer 1, and an upper electrode layer 5 formed further on it. The upper electrode layer 5 has a two-layer structure of a Ni electrode layer 3 and a Cu electrode layer 4 in this embodiment.

The lower electrode layer 1 is a conductive material containing at least a Ni electrode layer. The Ni electrode layer mentioned here is pure Ni (Ni 99.9% or higher) or Ni-alloy. In the case of alloy, it should desirably contain a precious metal element such as Pt, Pd, Ir, Ru, and Rh, and the content should desirably be 50 vol % or lower. If the content is within such a range, the thin film capacitor can obtain temperature load test and humidity load test equivalent to the case of using pure Ni. This Ni electrode layer and the dielectric layer 2 are in contact with each other. Thereby, the temperature load test and the humidity load test of the thin film capacitor are improved.

Further, this lower electrode layer 1 should preferably be a Ni metal foil. By adopting a metal foil, its difference in thermal expansion coefficient from the dielectric layer can be reduced, which allows suppressing the decrease in capacity as a thin film capacitor. Otherwise, although a Ni electrode layer may be formed by sputtering or vapor coating as the lower electrode layer 1 on a Si substrate or ceramic substrate (not shown), because a Si substrate has a greatly different thermal expansion coefficient from that of the dielectric layer, the capacity as a capacitor may decrease in cases.

Further, the lower electrode layer 1 may be a multilayer electrode film wherein a Ni electrode layer is placed on the face in contact with the dielectric layer 2. For example, it may be a structure wherein a Ni electrode layer is formed and stacked by sputtering or vapor coating on a Cu metal foil. In addition, an electrode on a Si substrate may have a structure wherein a metal such as Cu and Ni are each formed by sputtering or vapor coating and stacked. In the case of a Si substrate, there may be an adhesion layer such as TiN and $TiO_2$ or a $SiO_2$ layer between the Si substrate and an electrode layer. By the above, the equivalent series resistance (ESR) of the thin film capacitor decreases, and its temperature load test and humidity load test also improve.

The dielectric layer 2 should preferably be a perovskite-type dielectric material having a large dielectric constant. Among perovskite-type dielectric materials, any dielectric materials of barium titanate system not containing lead are preferred. In the case of dielectric materials of barium titanate system, those, of which a part of the Ba site is replaced with alkaline earths such as Ca and Sr, may be used. In addition, another of which a part of the Ti site is replaced with such elements as Zr, Sn, and Hf may be used. Further, rare-earth elements, Mn, V, Nb, Ta, or the like may be added to this dielectric material.

For forming the dielectric layer 2, a suitable method ordinarily used for thin film formation such as chemical solution deposition, sputtering, PLD (Pulse Laser Deposition), and CVD can be used.

The film thickness of the dielectric layer 2 should preferably be 1000 nm or less. If 1000 nm is exceeded, there is a risk that the capacity value of the capacitor per unit area may decrease. In addition, although there is no lower limit of the film thickness, as it becomes thinner, the insulation resistance value of the capacitor decreases. Therefore, it is believed that 50 nm or larger is necessary. Considering the above relationship between insulation resistance value and capacity, the range of the preferable film thickness of the dielectric layer 2 is believed to be between 250 nm and 1000 nm.

The Ni electrode layer 3 contained in the upper electrode layer 5 is in contact with the dielectric layer 2. The Ni electrode layer 3 mentioned here is pure Ni or Ni-alloy in the same manner as in the lower electrode layer 1. In the case of alloy, it should desirably contain a precious metal element such as Pt, Pd, Ir, Ru, and Rh, and the content should desirably be 50 vol % or lower. Further, its thickness should preferably be within a range of 0.1 μm or more and 2.0 μm or less. It is because being smaller than 0.1 μm may be insufficient for improving temperature load test or humidity load test. Another reason is that exceeding 2.0 μm tends to increase equivalent series resistance (ESR).

The Ni electrode layer 3 is a polycrystalline electrode layer wherein crystal grains constituting the layer have a columnar structure or granular structure. Whether in the columnar or granular structure, it has a preferable property in temperature load test. Concerning the humidity load test, although an improvement effect is seen whether in the columnar or granular structure, the granular structure is preferred because more improvement is seen in the humidity load test of the granular structure. Although the reason is not necessarily clear, according to the inventors' investigation, Cu ions which diffuse along grain boundaries are believed to be involved. The diffusion length of Cu ions which diffuse from the Cu electrode layer 4 induced during a humidity load test differs depending on the above-mentioned structure of the Ni electrode layer 3. Ordinarily, Cu ions diffuse through a part (grain boundaries) along interfaces between crystal grains formed by close piling of crystal grains of the Ni electrode layer 3. In comparing the diffusion path length of Cu ions inside the Ni electrode layer between the columnar structure and granular structure, because it becomes shorter in the case having the columnar structure, it is easier for Cu ions to diffuse into the Ni electrode layer than in the case of granular structure, resulting in a resistance decrease.

Formed on the Ni electrode layer 3 is the Cu electrode layer 4. The Cu electrode layer mentioned here is pure Cu (Cu 99.9% or higher) or Cu-alloy. In the case of alloy, it should desirably contain a precious metal such as Pt, Pd, Ir, Ru, and Rh, and the content should desirably be 50 vol % or lower. Cu has a characteristic of having equivalent resistivity to those of Au and Ag and being easy to be industrially used. Therefore, it is often used in wirings of electronic equipment. In addition, because its resistivity is relatively low, when used as an electrode layer of a capacitor, it has an effect of reducing the equivalent series resistance (ESR).

The Cu electrode layer 4 should preferably be a polycrystal wherein crystal grains constituting the layer have a columnar structure. By having a columnar structure, the number of grain boundaries which become barriers for electrons conducted along the film-thickness direction decreases, and the resistance of the Cu electrode layer becomes smaller. Therefore, when used as an electrode layer of the capacitor, it has an effect of reducing the equivalent series resistance (ESR).

In forming the upper electrode layer 5, a suitable method ordinarily used for thin film formation such as solution deposition, sputtering, pulse laser deposition (PLD), and chemical vapor deposition (CVD) can be used.

Here, each electrode layer "having a granular structure" means having a structure wherein each of crystal grains of the material constituting the electrode layer has a spherical shape, and the crystal grains are closely piled. The "spherical shape" is judged by the fact that when a cross section of the electrode layer is observed by an electron microscope or the like, Lmax/L is smaller than 1.5, where Lmax is the maximum length of a line segment formed by two arbitrary points on the edge of a crystal grain appearing on a cross section of an observed crystal grain, and L the maximum length of a line segment formed by two points where a line intersecting perpendicularly with that line segment intersects with the edge of the crystal grain. The above-mentioned region where crystal grains are observed may be any region where the whole thickness in the layer stacking direction of a target electrode layer can be observed on a cross section made by cutting the thin film capacitor along the layer stacking direction as in FIG. 1. Concerning an approximately perpendicular direction to the layer stacking direction, a region where at least 10 or more crystal grains can be observed in the target electrode layer may be adopted. Therefore, the value of Lmax/L indicates the average value over the 10 or more observed grains. If 50% or more grains are observed to have a granular shape as mentioned above, the electrode layer comprising those crystal grains is interpreted as a layer having a granular structure.

On the other hand, "having a columnar structure" indicates having a structure wherein each of crystal grains constituting the electrode layer has a column-like shape instead of the above-mentioned spherical shape, and these column-like grains are closely piled. This "column-like" shape indicates a case wherein a cross section of the electrode layer is observed by an electron microscope, and grains whose average value of Lmax/L observed in the same condition as mentioned earlier is 1.5 or larger occupy 50% or larger number of grains in the above-mentioned observation region.

In addition, there are cases wherein 50% or larger number of grains become one crystal grain per layer in the above-mentioned observation region. In this case, Lmax/L may be less than 1.5 at the same time. In such a case, from the viewpoint of having a small number of grain boundaries, it is interpreted as having the columnar structure in this embodiment.

These granular structure and columnar structure can be controlled by changing the condition in forming a film of the material which forms the electrode layer on a substrate or changing the heating condition after forming the film. For example, if the upper electrode layer 5 to be formed is made of an easily-oxidizable material, oxygen concentration is controlled in the process of forming the electrode layer. In addition, in heating the substrate and forming a film by sputtering, because the temperature may rise due to the influence of plasma, the atmosphere during the sputtering is adjusted. If the upper electrode layer 5 is heated after its formation, the atmosphere during heating, temperature range for heating, and further the sequence of film-forming and heating multiple electrodes are adjusted/changed. Through this kind of method, controlling the crystal structure of each electrode layer in the upper electrode layer 5 becomes possible.

This upper electrode layer 5 may be constituted of three or more layers. In the case of three layers, at least the Ni electrode layer 3 should be in contact with the dielectric layer 2 and contain the Cu electrode layer 4. In this case, there may be a conductive material layer such as a conductive oxide layer, a single metal layer, or an alloy layer between the Ni electrode layer 3 and the Cu electrode layer 4, and these conductive material layers may be in the upper side of the Cu electrode layer 4. However, in either case, the total thickness of the conductive material layers and the Ni electrode layer 3 excluding Cu electrode layer 4 should preferably be 2 μm or less. As examples of these conductive material layers, a LaNiO3 layer which is a conductive oxide, a layer containing at least one kind of Pt, Pd, Ir, Ru, and Rh by 50 vol % or more, a layer containing at least one kind of W, Mo, and Cr by 50 vol % or more, and the like can be listed. Thereby, while decreasing the equivalent series resistance, the temperature load test and the humidity load test of the thin film capacitor can be further improved.

In the upper electrode layer 5, if the electrode layer in contact with the dielectric layer 2 is not the above-mentioned Ni electrode layer 3 but another metal layer having a melting point equivalent or higher than Ni, such as a layer containing at least one kind of W, Mo, and Cr by 50 vol % or more, the insulation resistance of the capacitor element may degrade. In addition, if the electrode layer in contact with the dielectric layer 2 is a layer containing at least one kind of Pt, Pd, Ir, Ru, and Rh by 50 vol % or more or a conductive oxide layer such as LaNiO3, because an acid which erodes the dielectric layer is used during the patterning process to form the upper electrode layer 5, there is a possibility of damaging the dielectric layer, or even when the damage is minor, the equivalent series resistance may increase. On the other hand, if the electrode layer in contact with the dielectric layer 2 is Ni, an FeCl3 solution is mainly used in patterning the upper electrode layer 5, and when an FeCl3 solution is used, erosion can be easily suppressed by improving the density or adjusting the chemical composition of the dielectric layer. The above also applies to the electrode structure in the lower electrode layer 1. Therefore, the electrode layer in contact with the dielectric layer 2 in either the upper electrode layer 5 or the lower electrode layer 1 should preferably be a Ni electrode layer.

Because the lower electrode layer 1 ordinarily has a supporting substrate provided beneath it or a thick material such as a metal foil is often used as the lower electrode layer 1 itself, it is often insensitive to the influence of humidity load test. Therefore, crystal grains in the lower electrode layer 1 may be either granular or columnar, and even in the case of Ni electrode layer in the lower electrode layer, having a granular structure in the same manner as in the Ni electrode layer 3 of the upper electrode layer 5 can further improve the humidity load test.

Second Embodiment

Figure 2:
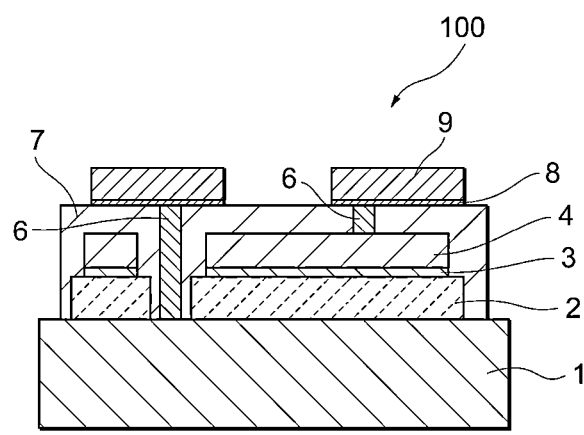
FIG. 2 is a schematic cross-sectional view showing a thin film capacitor of the second embodiment.

FIG. 2 is a cross-sectional view of a thin film capacitor which is the second embodiment of this invention. The thin film capacitor 100 is formed of a lower electrode layer 1, a dielectric layer 2 formed on the lower electrode layer 1, a Ni electrode layer 3 and a Cu electrode layer 4 formed further on it, a Cu-via wiring 6 for electrically connecting the lower electrode layer 1 and a Cu terminal electrode 9, and the Cu electrode layer 4 and the Cu terminal electrode 9, respectively, a polyimide passivation 7, and a Ti contact layer 8 placed for the purpose of improving the contact between the polyimide passivation 7 and the Cu terminal electrode 9. Basically, the thin film capacitor of the first embodiment is used to perform patterning of the upper electrode layer 5 and the dielectric layer 2 to form a terminal electrode. A thin film capacitor having this kind of structure also has the same efficacy as in the first embodiment.

Although preferred embodiments of this invention have been explained in the above, this invention is not limited to the above-mentioned embodiments.

[Embodiments]

Below, this invention will be explained more specifically using embodiments. However, this invention is not limited by the following embodiments.

A dielectric layer (BaTiO3 dielectric material) was formed with a thickness of 600 nm on a Ni metal foil of 100 mm×100 mm in size. Afterwards, annealing was performed to crystallize the dielectric layer on the Ni metal foil. Next, the upper electrode layer was formed. The upper electrode layer of the same kind and thickness as in Table 1 was formed.

In Embodiment 1-7 and 9 and Comparisons 1 and 2, upper electrode layers were formed by sequentially forming Ni and Cu films. In Embodiment 8, an upper electrode layer was formed after forming a Ni film, annealing at 550° C., and then forming a Cu film.

In Comparison 3, an upper electrode layer consisting of three layers was formed by depositing layers of Cr of 0.1 μm in thickness, Ni of 0.1 μm over it, and further Cu of 2 μm over it sequentially from the side in contact with a dielectric layer.

After forming the upper electrode layer, patterning was performed for the dielectric layer and the upper electrode layer, polyimide passivation was applied, and patterning was performed so that a via structure was formed. A Cu electrode was embedded in the via structure by sputtering so that a Cu-via wiring which was respectively and electrically connected to the upper electrode layer side and the lower electrode layer side was made. Afterwards, a Ti film was formed by sputtering for improving contact between the polyimide passivation and the Cu terminal electrode, and the Cu terminal electrode connecting to the wiring which was respectively and electrically connected to the upper electrode layer side and the lower electrode layer side was made by plating. Through this process, a panel having 5000 pieces of thin film capacitor elements (thin film capacitors 100) of Size 1005 (1 mm×0.5 mm) on a Ni foil as shown in FIG. 2 were fabricated.

performed by continuously applying a voltage of 4V for 1000 hours to each capacitor in an environment of 125° C. and checking a change in the insulation resistance value between before the test and after the test. In the same manner, the humidity load test was performed by continuously applying a voltage of 4V for 1000 hours to each capacitor in an environment of 60° C. and humidity 90% and checking a change in the insulation resistance value of the sample between before the test and after the test. The results are listed in Table 1. The fine structure of the upper electrode layer was checked by making STEM (scanning transmission electron microscope) observations. Judging whether crystal grains constituting the layer have granular or columnar shape was made by observing 50 grains. The judgment method is as described in the above. The lower electrode layer had a granular structure in every sample.

TABLE 1

| | Upper electrode layer 5 | | | | | | Insulation resistance value (Ω) when 1000 hr passed after starting temperature load test (DC 4 V 25° C.) | Insulation resistance value (Ω) when 1000 hr passed after starting humidity load test (DC 4 V 25° C.) | Equivalent series resistance (ESR) value (Ω) |
|---|---|---|---|---|---|---|---|---|---|
| Sample No. | Layer between dielectric layer and Ni electrode layer (μm) | Ni electrode layer thickness (μm) | Cu electrode layer thickness (μm) | Ni grain structure | Cu grain structure | Capacitor value (nF) | Insulation resistance value (Ω) | | |
| Comparison 1 | None | 0 | 2 | — | Columnar | 10.2 | $2.0 \times 10^{10}$ | 110 | 12 | 50 |
| Embodiment 1 | None | 0.1 | 2 | Granular | Columnar | 10 | $2.1 \times 10^{10}$ | $2.0 \times 10^{10}$ | $2.1 \times 10^{10}$ | 52 |
| Embodiment 2 | None | 0.3 | 2 | Granular | Columnar | 9.9 | $2.4 \times 10^{10}$ | $2.0 \times 10^{10}$ | $2.0 \times 10^{10}$ | 52 |
| Embodiment 3 | None | 0.5 | 2 | Granular | Columnar | 10.1 | $2.4 \times 10^{10}$ | $2.0 \times 10^{10}$ | $2.0 \times 10^{10}$ | 55 |
| Embodiment 4 | None | 1.0 | 2 | Granular | Columnar | 10.1 | $2.5 \times 10^{10}$ | $2.1 \times 10^{10}$ | $2.0 \times 10^{10}$ | 59 |
| Embodiment 5 | None | 1.5 | 2 | Granular | Columnar | 10.2 | $2.6 \times 10^{10}$ | $2.2 \times 10^{10}$ | $2.1 \times 10^{10}$ | 65 |
| Embodiment 6 | None | 2.0 | 2 | Granular | Columnar | 9.9 | $2.4 \times 10^{10}$ | $2.1 \times 10^{10}$ | $2.1 \times 10^{10}$ | 70 |
| Embodiment 7 | None | 2.5 | 2 | Granular | Columnar | 10 | $2.4 \times 10^{10}$ | $2.0 \times 10^{10}$ | $2.0 \times 10^{10}$ | 82 |
| Embodiment 8 | None | 0.1 | 2 | Columnar | Columnar | 10.1 | $2.2 \times 10^{10}$ | $2.1 \times 10^{10}$ | $3.2 \times 10^{8}$ | 52 |
| Embodiment 9 | None | 0.05 | 2 | Granular | Columnar | 10 | $2.2 \times 10^{10}$ | $2.1 \times 10^{8}$ | $3.2 \times 10^{8}$ | 51 |
| Embodiment 10 | None | 0.1 | 2 | Granular | Granular | 10.1 | $2.3 \times 10^{10}$ | $2.0 \times 10^{10}$ | $2.0 \times 10^{10}$ | 55 |
| Comparison 2 | None | 2.0 | 0 | Granular | — | 10.1 | $2.1 \times 10^{10}$ | $2.1 \times 10^{10}$ | $1.9 \times 10^{10}$ | 90 |
| Comparison 3 | Cr 0.1 μm | 0.1 | 2 | Granular | Columnar | 10.1 | $1.2 \times 10^{8}$ | $5.6 \times 10^{5}$ | $4.0 \times 10^{4}$ | 55 |

Panels on which thin film capacitor elements corresponding to Embodiments 1-9 were fabricated and panels on which thin film capacitor elements corresponding to Comparisons 1-3 were annealed in vacuum at 340° C. This annealing was performed for growing grains in the Cu electrode layer. Concerning a panel on which the thin film capacitor elements corresponding to Embodiment 10 were fabricated, one with no annealing performed was fabricated. By dicing this panel having 5000 pieces of thin film capacitor elements, individual capacitor element samples of Size 1005 (1 mm×0.5 mm) were fabricated. On these individual pieces of samples, measurements of capacity value, insulation resistance value, and equivalent series resistance (ESR), temperature load test evaluation, and humidity load test were performed as explained below.

Figure 3:
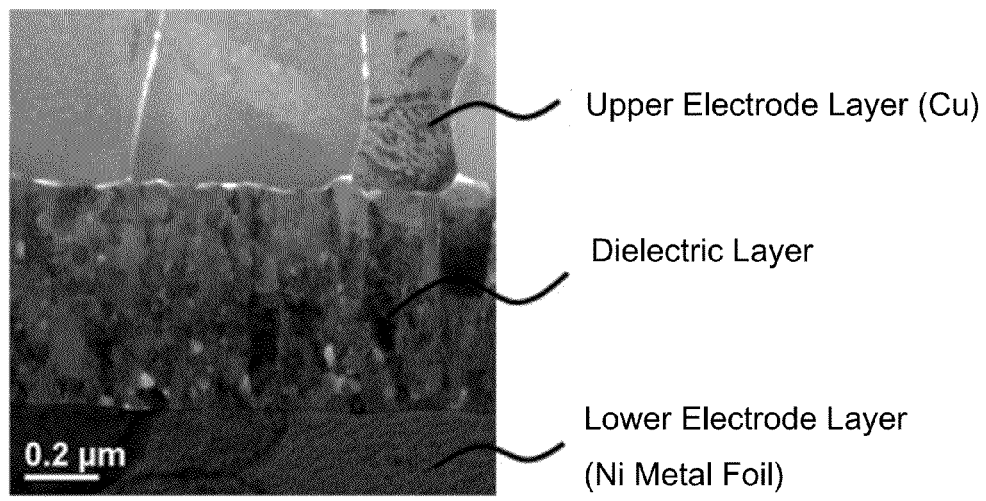
FIG. 3 is a cross-sectional observation image by a scanning transmission electron microscope (STEM) of a thin film capacitor sample wherein only a Cu electrode layer is constructed as the upper electrode layer (Comparison 1).
Figure 4:
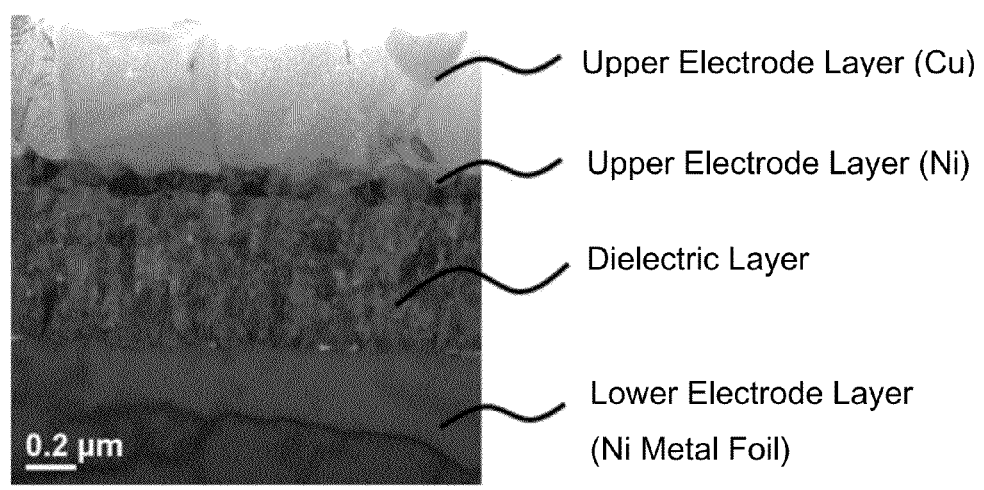
FIG. 4 is a cross-sectional observation image by a scanning transmission electron microscope (STEM) of a thin film capacitor sample wherein a Ni electrode layer and a Cu electrode layer are constructed as the upper electrode layer (Embodiment 1).

The capacity values were measured using an LCR meter 4284A manufactured by Agilent Co. at 1 kHz, 1 Vrms, and room temperature (25° C.). The insulation resistance values were measured using a high-resistance meter 4339B manufactured by Agilent Co. at DC 4V and room temperature (25° C.). In addition, the equivalent series resistance (ESR) values were measured using an impedance analyzer E4991A manufactured by Agilent Co. at room temperature (25° C.). Concerning the reliability tests, the temperature load test was Examples of cross-sectional observations in Comparison 1 and Embodiment 1 are shown in FIG. 3 and FIG. 4.

The electric properties in Table 1 are each average values of N=10 pieces of samples. In addition, the Ni grain shape and Cu grain shape in the upper electrode layer 5 are results of observing one sample each from each embodiment. It became clear from Table 1 that changing the thickness of the Ni electrode layer constituting the upper electrode layer do not significantly change the capacity value or the insulation resistance value of the thin film capacitor.

In the case of Comparison 1, there were deficiencies in temperature load test and humidity load test. Cu constituting the upper electrode layer has a higher oxidization rate than Ni, and thus it was believed that reduction of the dielectric material was induced at the same time as metal oxidization. It was believed that the cause of the reliability decline was the fact that that oxygen defects generated along with this dielectric material reduction moved during the reliability tests and degraded resistance.

In comparing Embodiment 1 and Embodiment 8, although there was no problem in temperature load test, some decrease in resistance was observed in humidity load test. This was believed to be due to the fact that Cu ions migrated from the Cu electrode layer during the humidity load test and diffused through grain boundaries, which cause the decrease in resistance. Compared with the granular structure, in the columnar structure the number of grain boundaries in the film thickness direction decreases, and the path of material movement become shorter. Therefore, it was believed that Cu ion migration could not be sufficiently suppressed.

In comparing Embodiment 1 and Embodiment 9, some decrease in resistance was observed in both temperature load test and humidity load test. Concerning Embodiment 9, because the Ni electrode layer is 50 nm which is thinner than those in other embodiments, it was believed that there are parts with non-uniform coverage factor of the dielectric layer surface. Therefore, it was believed that the parts where contact between Cu and the dielectric layer could easily occur showed decreased resistance during the reliability tests. As the result, it was believed that the Ni electrode layer should desirably be required to be 0.1 μm or more.

In addition, as in Embodiments 1-7, if the Ni electrode layer constituting the upper electrode layer was made thicker, although there was no problem in reliability, there observed was a trend that equivalent series resistance (ESR) as a thin film capacitor increased. This is believed to be caused by the fact that the resistivity of Ni is $6.99 \times 10^{-8}$ (Ωm) which is high relative to the resistivity of Cu which is $1.68 \times 10^{-8}$ (Ωm), and that Ni is magnetic material which has 600 magnetic permeability, so that the skin depth at high frequencies becomes as short as about 1/10 of that of Cu. Therefore, the preferred range of the Ni electrode layer is 0.1 μm or larger and 2.0 μm or smaller.

Further, as shown in Comparison 2, although the ones with only the Ni electrode layer formed in the upper electrode layer had no problem in reliabilities such as temperature load test or humidity load test, their equivalent series resistance (ESR) increased. The cause was believed to be the fact that the resistivity of Ni is higher than that of Cu and that the skin depth became shorter.

In Embodiment 10, although there was no problem in temperature load test or humidity load test in comparison with Embodiment 1, the equivalent series resistance slightly increased. Therefore, it became evident that the grain structure of the Cu electrode layer should desirably have a columnar structure.

Comparison 3 has a structure wherein Cr instead of Ni is formed as the Ni electrode layer in contact with the dielectric layer. Further, a Ni electrode layer and a Cu electrode layer are formed on the Cr electrode layer. This Cr electrode layer had a granular structure. In this case, it became evident that the insulation resistance value of the capacitor declines and that both the temperature load test and the humidity load test become worse.

What is claimed is:

1. A thin film capacitor, comprising:
    a lower electrode layer;
    a dielectric layer that is provided on said lower electrode layer; and
    an upper electrode layer that is formed on the dielectric layer;
    wherein
    the lower electrode layer contains at least a Ni electrode layer,
    the upper electrode layer configured with at least two layers of a Ni electrode layer and a Cu electrode layer, and
    the dielectric layer is in contact with both the Ni electrode layer of the lower electrode layer and the Ni electrode layer of the upper electrode layer.

2. The thin film capacitor according to claim 1, wherein
    the Ni electrode layer of the upper electrode layer has a granular structure, and
    the Cu electrode layer of the upper electrode layer has a columnar structure.

3. The thin film capacitor according to claim 2, wherein the Ni electrode layer of the upper electrode layer has a thickness of 0.1 μm or more and 2.0 μm or less.

4. The thin film capacitor according to claim 2, wherein the dielectric layer is a barium titanate system dielectric material.

5. The thin film capacitor according to claim 2, wherein the lower electrode layer is a Ni metal foil.

6. The thin film capacitor according to claim 1, wherein the Ni electrode layer of the upper electrode layer has a thickness of 0.1 μm or more and 2.0 μm or less.

7. The thin film capacitor according to claim 6, wherein the dielectric layer is a barium titanate system dielectric material.

8. The thin film capacitor according to claim 6, wherein the lower electrode layer is a Ni metal foil.

9. The thin film capacitor according to claim 1, wherein the dielectric layer is a barium titanate system dielectric material.

10. The thin film capacitor according to claim 9, wherein the lower electrode layer is a Ni metal foil.

11. The thin film capacitor according to claim 1, wherein the lower electrode layer is a Ni metal foil.

* * * * *